United States Patent
Nguyen

(10) Patent No.: US 7,242,235 B1
(45) Date of Patent: Jul. 10, 2007

(54) DUAL DATA RATE FLIP-FLOP

(75) Inventor: Nam Duc Nguyen, San Jose, CA (US)

(73) Assignee: Exar Corporation, Fremont, CA (US)

( * ) Notice: Subject to any disclaimer, the term of this patent is extended or adjusted under 35 U.S.C. 154(b) by 93 days.

(21) Appl. No.: 11/067,513

(22) Filed: Feb. 25, 2005

(51) Int. Cl.
*H03K 3/356* (2006.01)

(52) U.S. Cl. ...................... 327/210; 327/211
(58) Field of Classification Search ................ 327/210, 327/211
See application file for complete search history.

(56) References Cited

U.S. PATENT DOCUMENTS

| | | | | |
|---|---|---|---|---|
| 4,811,364 A * | 3/1989 | Sager et al. | ................ | 375/354 |
| 4,873,456 A * | 10/1989 | Olisar et al. | ................ | 327/202 |
| 5,589,787 A * | 12/1996 | Odinot | ................ | 327/202 |
| 6,300,809 B1 * | 10/2001 | Gregor et al. | ................ | 327/200 |
| 6,317,842 B1 * | 11/2001 | Nguyen | ................ | 713/400 |
| 6,362,680 B1 * | 3/2002 | Barnes | ................ | 327/407 |
| 6,691,272 B2 * | 2/2004 | Azim | ................ | 714/744 |
| 6,938,225 B2 * | 8/2005 | Kundu | ................ | 716/1 |
| 6,943,605 B2 * | 9/2005 | Thadikaran et al. | ........ | 327/218 |

\* cited by examiner

*Primary Examiner*—Kenneth B. Wells
(74) *Attorney, Agent, or Firm*—Townsend and Townsend and Crew LLP

(57) ABSTRACT

A flip-flop is configured to operate either in a double data-rate mode or a normal mode. When configured to operate in the double data-rate mode, the flip-flop outputs data on both edges of the applied clock. When configured to operate in the normal mode, the flip-flop outputs data on either the rising or falling edges of the applied clock. In the double data-rate mode, when a first latch disposed in the flip-flop operates in a sampling mode, the second latch disposed in the flip-flop operates in a holding mode to supply the output data, and when the second latch operates in the sampling mode, the first latch operates in the holding mode to supply the output data. Accordingly, with each of the rising or falling edge of the clock, one of the latches supplies an output data.

4 Claims, 3 Drawing Sheets

DUAL DATA RATE FLIP-FLOP

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to electronic circuits, and more particularly to storage elements used in sequential logic circuits.

Flip-flops are widely used in electronics circuits to store data. FIG. 1 is a block diagram of a flip-flop 10 commonly referred to as master-slave flip-flop. Master-slave flip-flop 10 includes a master D-latch 12, a slave D-latch 14, and an inverter 16. When clock signal CLK is at a high logic level (high), slave latch 14 is enabled, i.e., samples the data, and its output Q is the same as the master latch 12 output Y. When clock signal CLK is high, master latch 12 is disabled, i.e., latches (holds) its data. When signal CLK is at a low logic level (low), master latch 12 is enabled and the data in the external D input is transferred to the master latch 12 output Y. When signal CLK is low, slave latch 14 is disabled, holds its data, and thus any changes in the external D input changes the master latch output Y and cannot change the slave output Y. When signal CLK returns to high, master latch 12 is in the latched mode and is isolated from the D input. At the same time, slave latch 14 is enabled and the value of Y is transferred to the output Q.

A D-latch may be formed using transmission gates and inverters, as shown in FIG. 2. Input CLK controls the two transmission gates 22, 24. When CLK is low, transmission gate 22 has a closed path and transmission gate 24 has an open path, therefore, D-latch 20 is in a sampling mode. This cause output $\overline{Q}$ to be the inverse of input D and output Q to be the same as input D. When CLK is high, transmission gate 24 has a closed path and transmission gate 22 has an open path, therefore, D-latch 20 is in a holding mode; this causes outputs Q and $\overline{Q}$ to hold their previous values.

A need continues to exist for a flip-flop that can operate at higher data rates for any given clock frequency.

BRIEF SUMMARY OF THE INVENTION

In accordance with the present invention, a flip-flop is configured to operate either in a double data-rate mode or a normal mode. When configured to operate in the double data-rate mode, the flip-flop outputs data on both edges of the applied clock. When configured to operate in the normal mode, the flip-flop outputs data on either the rising or falling edges of the applied clock.

If operating in the double data-rate mode, when a first latch disposed in the flip-flop operates in a sampling mode, in response to, for example, to a rising edge of a clock, the second latch disposed in the flip-flop operates in a holding mode to supply the output data. Similarly, in the double data-rate mode, when the second latch operates in the sampling mode, in response to, for example, a falling edge of a clock, the first latch operates in the holding mode to supply the output data. Accordingly, with each of the rising or falling edge of the clock, one of the latches supplies an output data. In some embodiments, the double data-rate mode is selected in response to a mode select signal. When the mode select signal is not selected (e.g., is at a low logic level), the flip-flop operates in a normal mode and supplies data only at either the rising or the falling edge of the clock signal.

In some embodiments, a first multiplexer receives the input data at its first terminal and the output signal of the first latch at its second terminal. In response to a first select signal, the first multiplexer supplies its output signal to the second latch. The first select signal is generated by an inverter logic gate that receives the mode select signal. The outputs of the first and second latches are supplied to a second multiplexer, which in response to a second select signal, supplies one of these receive signals as an output signal of the flip-flop. The second select signal is generated by an AND logic gate that receives the clock signal and the mode select signal.

BRIEF DESCRIPTION OF THE DRAWINGS

FIG. 3 is a high-level block diagram of a double data-rate flip-flop, in accordance with one embodiment of the present invention.

DETAILED DESCRIPTION OF THE INVENTION

In accordance with the present invention, a flip-flop is configured to operate either in a double data-rate (DDR) mode or a normal mode. When configured to operate in the double data-rate mode, the flip-flop samples and outputs data on both edges of the applied clock. When configured to operate in the normal mode, the flip-flop outputs data on either the rising or falling edges of the applied clock.

Figure 1:
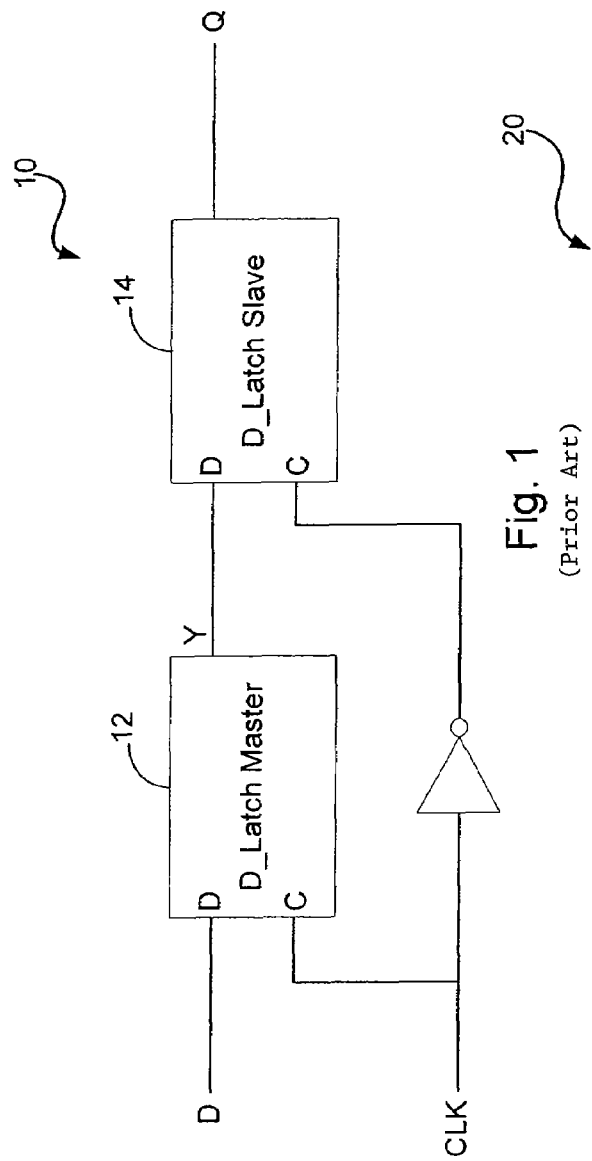
FIG. 1 is a block diagram of a flip-flop, as known in the prior art.
Figure 2:
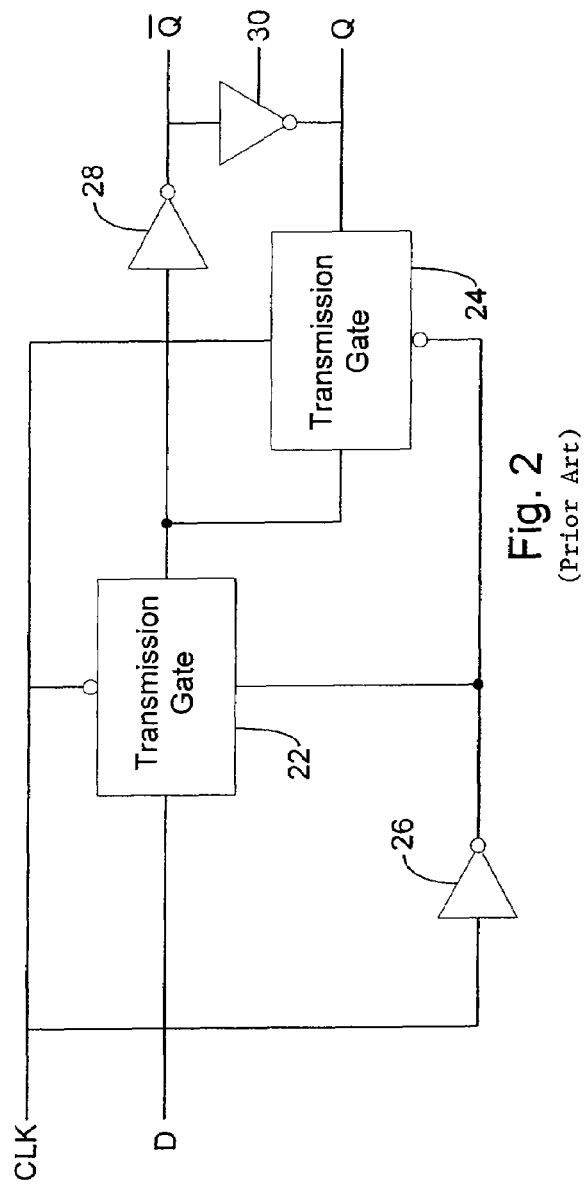
FIG. 2 is a block diagram of a D-latch, as known in the prior art.
Figure 3:
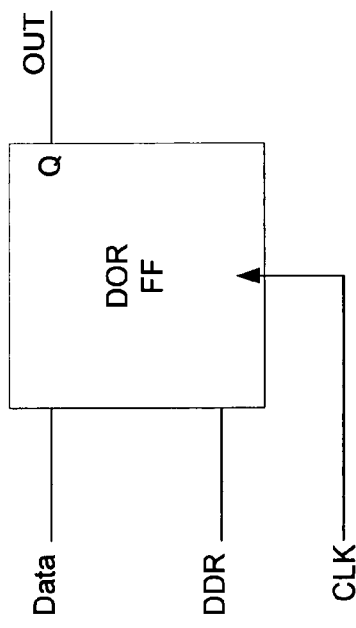
FIG. 3 is a block diagram of a double data-rate flip-flop, in accordance with one embodiment of the present invention.

FIG. 3 is a block diagram of the dual data-rate flip flop 100, in accordance with one embodiment of the present invention. Flip-flop 100 includes three input terminals, namely Data, DDR, and Clk, and an output terminal Out. When signal DDR is at, for example, a high logic level, signal OUT is updated with signal Data, at each rising and falling edge of the clock signal Clk. When signal DDR is at, for example, a low logic level, signal OUT is updated with signal Data, at each of either rising or falling edge of the clock signal Clk.

Figure 4:
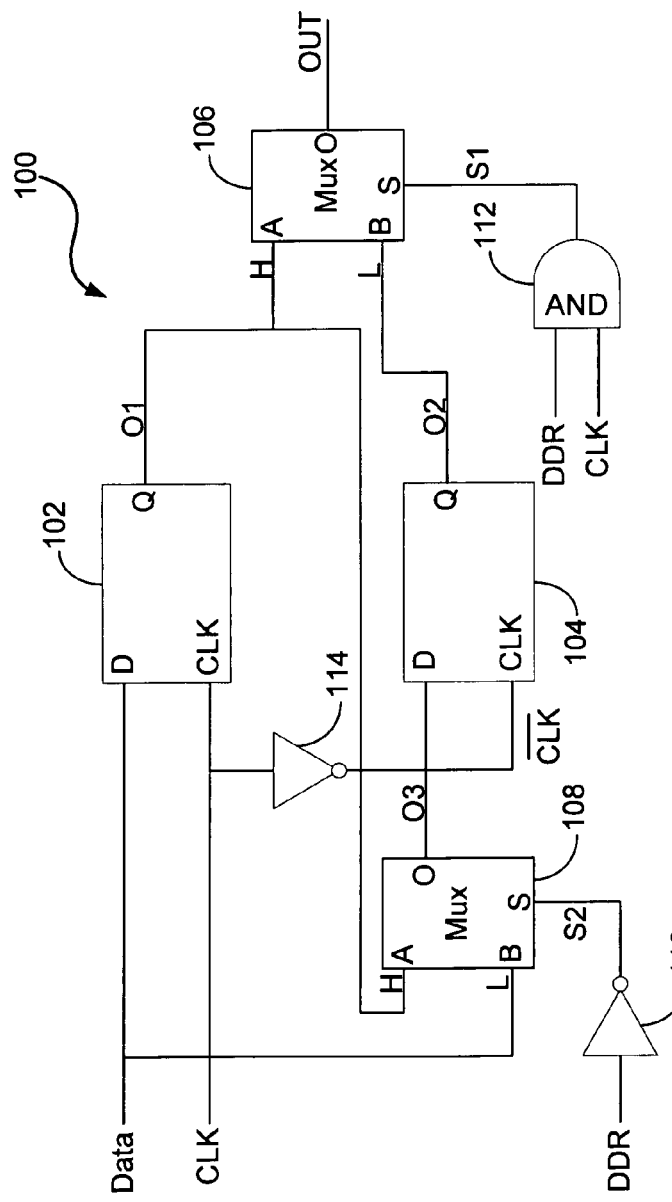
FIG. 4 shows the various logic blocks disposed in the double data-rate flip-flop of FIG. 3, in accordance with one embodiment of the present invention.

FIG. 4 shows various logic blocks disposed in flip-flop 100, in accordance with one exemplary embodiment. The exemplary embodiment 100 of the DDR flip-flop 100 is shown as including a pair of latches 102, 104, a pair of multiplexers (mux) 106, 108, logic AND gate 112, and logic inverter gates 110, 114. Data Input terminal D of latch 102 receives input data signal Data. Clock input terminal of latch 102 receives input clock signal Clk. Inverter 114 inverts signal Clk and applies the inverted signal Clk to the clock input terminal Clk of latch 104. Output signal O1 of latch 102 is applied to input terminal A of mux 106, and output signal O2 of latch 104 is applied to input terminal B of mux 106. Select input terminal S of mux 106 is driven by signal S1 generated at the output of AND gate 112, which receives input signals CLK, and DDR. When signal S1 is at a high logic level, signal Out is the same as signal O1, and when signal S1 is at a low logic level, signal Out is the same as signal O2.

Signal O1 is also supplied to input terminal A of mux 108, which also receives signal Data at its input terminal B. Select input terminal S of mux 108 is driven by signal S2 generated at the output of inverter gate 110, which receives input signal DDR. When signal S2 is at a low level, signal O3 is the same as signal Data, and when signal S2 is at a high logic level, signal O3 is the same as signal O1. When signal DDR is at a high logic level, flip-flop 100 operates in the double data-rate mode, and when signal DDR is at a low logic level, flip-flop 100 operates in the normal mode, as described further below. When the CLK input terminal of latch 102 receives a high logic level signal (i.e., when signal Clk is high), latch 102 is in a holding mode, and when the CLK input terminal of latch 102 receives a low logic level signal (i.e., when signal Clk is low), latch 102 is in a sampling mode. Similarly, when the CLK input terminal of latch 104 receives a high logic level signal (i.e., when signal Clk is high), latch 104 is in a holding mode, and when the CLK input terminal of latch 104 receives a low logic level signal (i.e., when signal Clk is low), latch 104 is in a sampling mode. Accordingly, when latch 102 is in a holding mode, latch 104 is in a sampling mode, and vice versa. Mux 106 is configured to output data from the latch that is in the holding mode.

Assume signal DDR is at a high logic level, causing flip-flop 100 to be in the double data-rate mode. Because in this mode signal S2 is at a low logic level, signal Data is supplied to the input terminals of both latches 102, and 104. When signal Clk is at a low logic level, signal S1 is at a low logic level, causing signal Out to be the same as signal O2. When signal Clk is at a low logic level, latch 104 is in a holding mode. Therefore, signal O2 maintains its previous value and is isolated from the node carrying signal Data. Therefore, changes in Data do not affect the changes in the output signal. Therefore in the DDR mode, when signal Clk is at a low logic level, signal Out is the same as signal Data.

Assume while in the DDR mode, signal Clk is at a high logic level. Therefore, signal S1 is at a high logic level, causing signal Out to be the same as signal O1. When signal Clk is at a high logic level, latch 102 is in a holding mode. Therefore, signal O2 maintains its previous value and is isolated from the node carrying signal Data. Therefore, changes in Data do not affect the changes in the output signal. Therefore in the DDR mode, when signal Clk is at a high logic level, signal Out is the same as signal Data. Therefore, while in the DDR mode, with each rising or falling edge of clock signal Clk, data is transferred to the output terminal Out of DDR flip-flop 100.

Assume signal DDR is at a low logic level, causing flip-flop to be in a normal mode. When signal DDR is at a low logic level, signal S2 is at a high logic level, thereby causing signal O2 to be the same as signal O3. Furthermore, because signal S1 is at a low logic level, signal Out is the same as signal O2. Therefore, in the normal mode, the output signal O1 of latch 102 is supplied to input terminal O3 of latch 104, whose output signal O2 is the same as the output signal Out of mux 106. In other words, in the normal mode, latch 102 operates as a master latch of flip-flop 100, and latch 104 operates as a slave latch of flip-flop 100, and transfers data at each rising edges of the clock signal Clk. During the normal mode, data from latch 102 is inhibited from reaching the output terminal of the flip-flop via mux 106. In some embodiment, multiplexer 108 may be included in the input stage of latch 104 to further reduce the number of logic gates.

Figure 5:
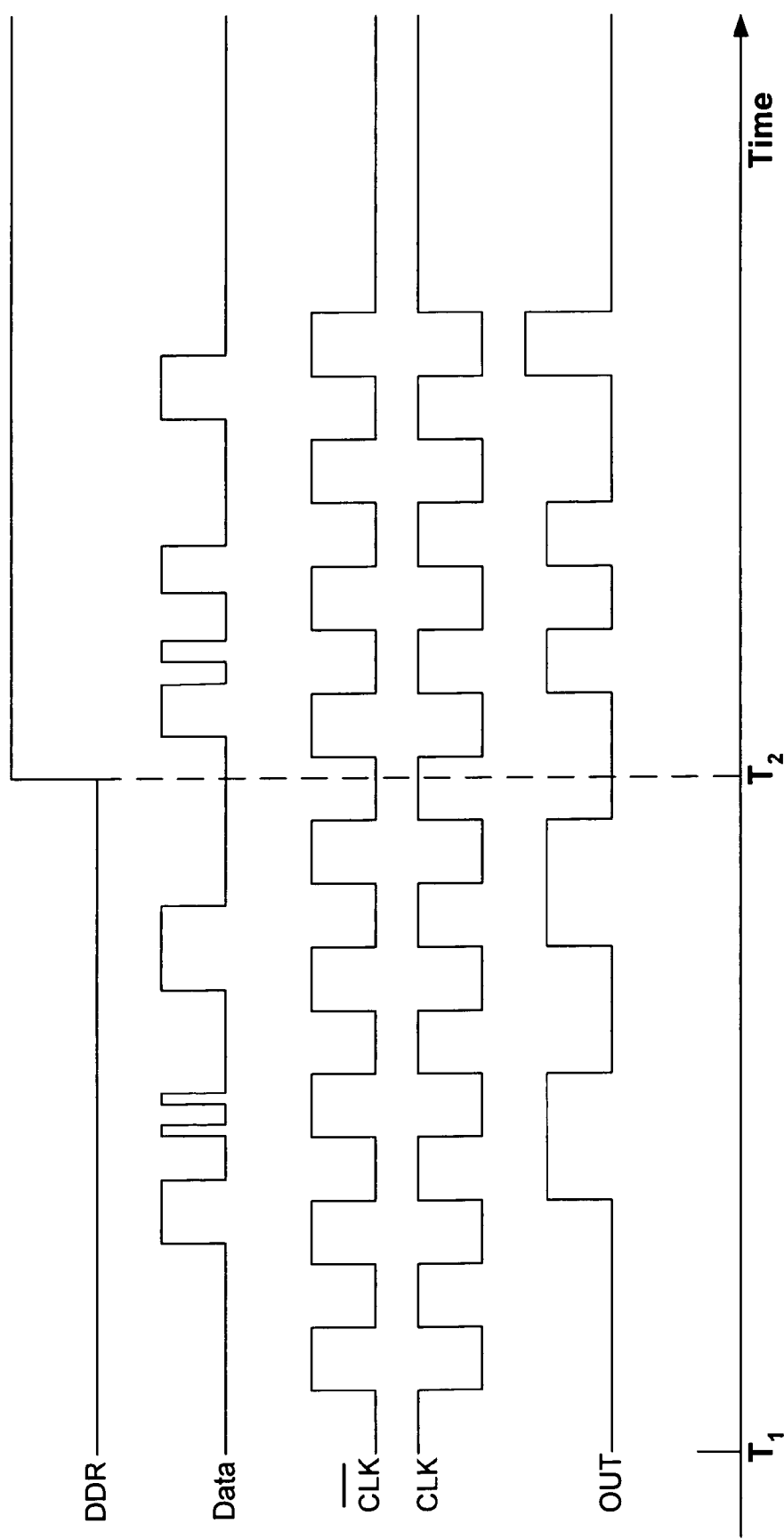
FIG. 5 is a timing diagram of the signals associated with the double data-rate flip-flop shown in FIG. 4.

FIG. 5 is an exemplary timing diagram of signal DDR, Data, Clk, and Out, associated with DDR flip-flop 100. During times T1, T2; signal DDR is set to a low level, therefore, output signal OUT is shown as changing only with each rising edge of the clock signal Clk. After time T2, signal DDR is set to a high logic level, therefore, output signal OUT is shown as changing with each of the rising and falling edges of the clock signal Clk.

The above embodiments of the present invention are illustrative and not limiting. Various alternatives and equivalents are possible. The invention is not limited to the type of logic, such as common mode logic, differential mode logic, or the like used in the dual rate flip-flop. The invention is not limited by the type of delay chain, or control circuitry of the present invention. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed is:

1. A flip-flop comprising:
   a first latch configured to operate in a sampling mode when a clock signal is at a first logic level and in a holding mode when the clock signal is at a second logic level; said first latch having a data input terminal configured to receive a data signal;
   a second latch configured to operate in a holding mode when the clock signal is at the first logic level and in a sampling mode when the clock signal is at the second logic level; said first latch having a data input terminal configured to receive the data signal;
   a first logic gate configured to receive a first output signal supplied by the first latch and a second output signal supplied by the second latch; said first logic gate further configured to supply one of the received first and second output signals as an output signal of the flip-flop, wherein said first logic gate is a first multiplexer having first and second input terminals that receive the first and second output signals, and a select terminal adapted to receive a first select signal generated in response to a mode select signal, wherein said first select signal is generated by a logic gate performing an AND function and adapted to receive the clock signal and the mode select signal and to generate the first select signal in response.

2. The flip-flop of claim 1 further comprising:
   a second logic gate adapted to receive the first output signal and the data signal, said second logic gate further configured to supply one of its received signal as a data signal to the second latch.

3. The flip-flop of claim 2 wherein said second logic gate is a second multiplexer having first and second input terminals that receive the first output signal and the data signal, and a select terminal adapted to receive a second select signal generated in response to the mode select signal.

4. The flip-flop of claim 3 wherein said second select signal is generated by a logic gate performing a NOR function and adapted to receive an inverse of the clock signal and the mode select signal and to generate the second select signal in response.

* * * * *